United States Patent
Ono et al.

(10) Patent No.: US 11,922,887 B1
(45) Date of Patent: Mar. 5, 2024

(54) DISPLAYS WITH REDUCED DATA LINE CROSSTALK

(71) Applicant: Apple Inc., Cupertino, CA (US)

(72) Inventors: Shinya Ono, Santa Clara, CA (US); Chin-Wei Lin, San Jose, CA (US); Chuan-Jung Lin, Yunlin (TW); Gihoon Choo, San Jose, CA (US); Hassan Edrees, Cupertino, CA (US); Hei Kam, Santa Clara, CA (US); Jung Yen Huang, Taoyuan (TW); Pei-En Chang, San Jose, CA (US); Rungrot Kitsomboonloha, San Jose, CA (US); Szu-Hsien Lee, Los Gatos, CA (US); Zino Lee, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 321 days.

(21) Appl. No.: 17/368,472

(22) Filed: Jul. 6, 2021

Related U.S. Application Data

(60) Provisional application No. 63/072,013, filed on Aug. 28, 2020.

(51) Int. Cl.
| | |
|---|---|
| *G09G 3/3275* | (2016.01) |
| *H10K 59/121* | (2023.01) |
| *H10K 59/126* | (2023.01) |
| *H10K 59/131* | (2023.01) |

(52) U.S. Cl.
CPC ....... *G09G 3/3275* (2013.01); *H10K 59/1213* (2023.02); *H10K 59/1216* (2023.02); *H10K 59/126* (2023.02); *H10K 59/131* (2023.02); *G09G 2320/0214* (2013.01)

(58) Field of Classification Search
CPC ......... G09G 3/3275; G09G 2320/0214; H10K 59/131; H10K 59/1213; H10K 59/126; H10K 59/1216
See application file for complete search history.

(56) References Cited

U.S. PATENT DOCUMENTS

| | | | |
|---|---|---|---|
| 7,209,057 B2 | 4/2007 | Hashido et al. | |
| 7,808,690 B2 | 10/2010 | Kubota | |
| 9,530,801 B2 | 12/2016 | Nozu et al. | |
| 10,249,695 B2 | 4/2019 | Ono et al. | |
| 10,324,570 B2 | 6/2019 | Kimura et al. | |
| 10,386,962 B1 | 8/2019 | Jin et al. | |
| 2007/0080905 A1 | 4/2007 | Takahara | |
| 2017/0123268 A1 | 5/2017 | Sasaki et al. | |
| 2018/0047335 A1* | 2/2018 | Hwang | G09G 3/2092 |

(Continued)

*Primary Examiner* — Kenneth B Lee, Jr.
(74) *Attorney, Agent, or Firm* — Treyz Law Group; Jason Tsai

(57) ABSTRACT

A display may include an array of pixels. Each pixel in the array includes an organic light-emitting diode coupled to associated thin-film transistors. The diode may be coupled to drive transistor circuitry, a data loading transistor, and emission transistors. The drive transistor circuitry may include at least two transistor portions connected in series. The data loading transistor has a drain region connected to a data line and a source region connected directly to the drive transistor circuitry. The data line may be connected to and overlap the drain region of the data loading transistor. The data line and the source region of the data loading transistor are non-overlapping to reduce row-to-row crosstalk.

20 Claims, 10 Drawing Sheets

(56) References Cited

U.S. PATENT DOCUMENTS

| | | | |
|---|---|---|---|
| 2019/0148419 A1* | 5/2019 | Song | G02F 1/136286 |
| | | | 349/42 |
| 2019/0179467 A1 | 6/2019 | Kim et al. | |
| 2019/0206320 A1* | 7/2019 | Nam | G09G 3/3258 |
| 2020/0194417 A1 | 6/2020 | Yeon et al. | |
| 2021/0066429 A1* | 3/2021 | Kim | G09G 3/3266 |

* cited by examiner

DISPLAYS WITH REDUCED DATA LINE CROSSTALK

This application claims the benefit of provisional patent application No. 63/072,013, filed Aug. 28, 2020, which is hereby incorporated by reference herein in its entirety.

BACKGROUND

This relates generally to electronic devices with displays and, more particularly, to display driver circuitry for displays such as organic light-emitting diode (OLED) displays.

Electronic devices often include displays. For example, cellular telephones and portable computers typically include displays for presenting image content to users. OLED displays have an array of display pixels based on light-emitting diodes. In this type of display, each display pixel includes a light-emitting diode and associated thin-film transistors for controlling application of data signals to the light-emitting diode to produce light.

SUMMARY

An electronic device may include a display having an array of display pixels. The display pixels may be organic light-emitting diode display pixels. Each display pixel may include at least an organic light-emitting diode (OLED) that emits light, drive transistor circuitry coupled in series with the light-emitting diode, a data loading transistor having a source region and a drain region, and one or more emission control transistors coupled in series with the light-emitting diode. The source region of the data loading transistor may be coupled to the drive transistor circuitry. A data line may be coupled to and routed over the drain region of the data loading transistor. The data line does not overlap with the source region of the data loading transistor to reduce row-to-row data crosstalk.

The data loading transistor may have a channel region that extends along a first direction. The drive transistor circuitry may have first and second channel regions extending along a second direction that is perpendicular to the first direction. The channel regions of the data loading transistor and the drive transistor circuitry are formed using a silicon trace. The first channel region and the second channel region of the drive transistor circuitry may be connected in series using a portion of the silicon trace. The first and second channel regions are overlapped by a gate conductor of the drive transistor circuitry. The portion of the silicon trace connecting the first and second channel regions in series are not overlapped or covered by the gate conductor. The portion of the silicon trace connecting the first and second channel regions may include at least two 90 degree bends. The first and second channels of the drive transistor circuitry may each have a length and a width. The length may be at least two to ten times longer than the width.

Each display pixel may further include a metal shielding layer at least partially covering the data loading transistor. Each display pixel might also include another metal shielding layer covering the drive transistor circuitry. The metal shielding layers may be configured to receive a power supply voltage and may sometimes be referred to as a power supply shielding plate.

DETAILED DESCRIPTION

Figure 1:
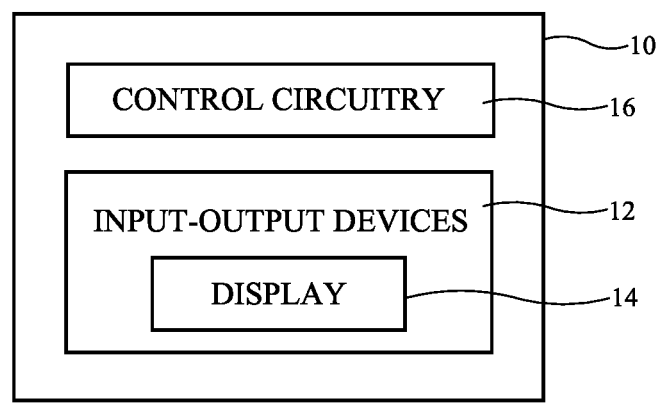
FIG. 1 is a diagram of an illustrative electronic device having a display in accordance with some embodiments.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, application processors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode (OLED) display are sometimes described herein as an example. This is, however, merely illustrative. Any suitable type of display may be used in device 10, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
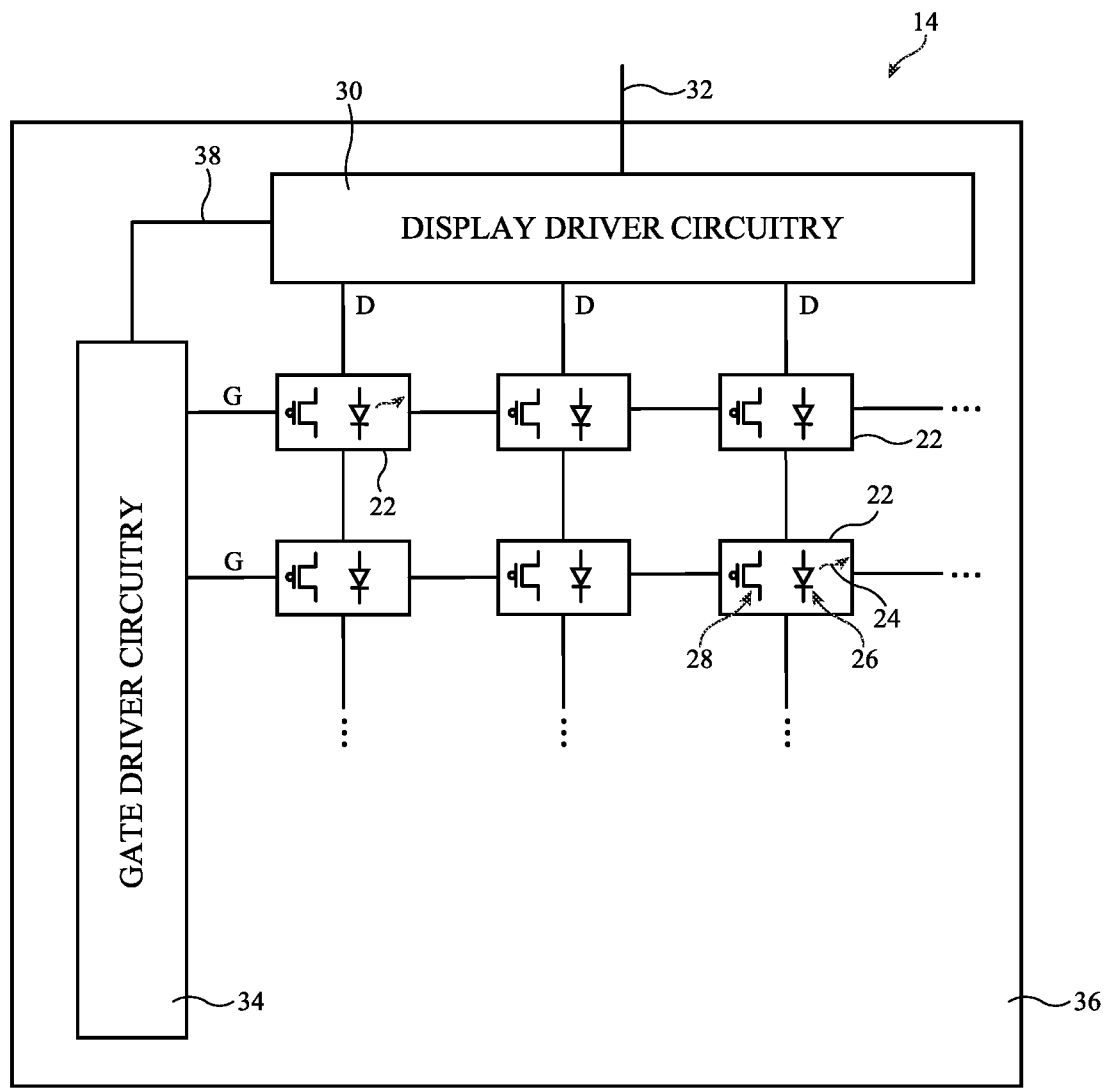
FIG. 2 is a diagram of an illustrative display having an array of organic light-emitting diode display pixels in accordance with some embodiments.

A top view of a portion of display 14 is shown in FIG. 2. As shown in FIG. 2, display 14 may have an array of pixels 22 formed on a substrate 36. Substrate 36 may be formed from glass, metal, plastic, ceramic, porcelain, or other substrate materials. Pixels 22 may receive data signals over signal paths such as data lines D (sometimes referred to as data signal lines, column lines, etc.) and may receive one or more control signals over control signal paths such as horizontal control lines G (sometimes referred to as gate lines, scan lines, emission lines, row lines, etc.). There may be any suitable number of rows and columns of pixels 22 in display 14 (e.g., tens or more, hundreds or more, or thousands or more).

Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry 30 may be used to control the operation of pixels 22. The display driver circuitry 30 may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row driver circuitry) may be implemented as part of an integrated circuit and/or may be implemented using thin-film transistor circuitry. Horizontal/ row control lines G in display 14 may carry gate line signals (scan line control signals), emission enable control signals, and/or other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.).

Figure 3:
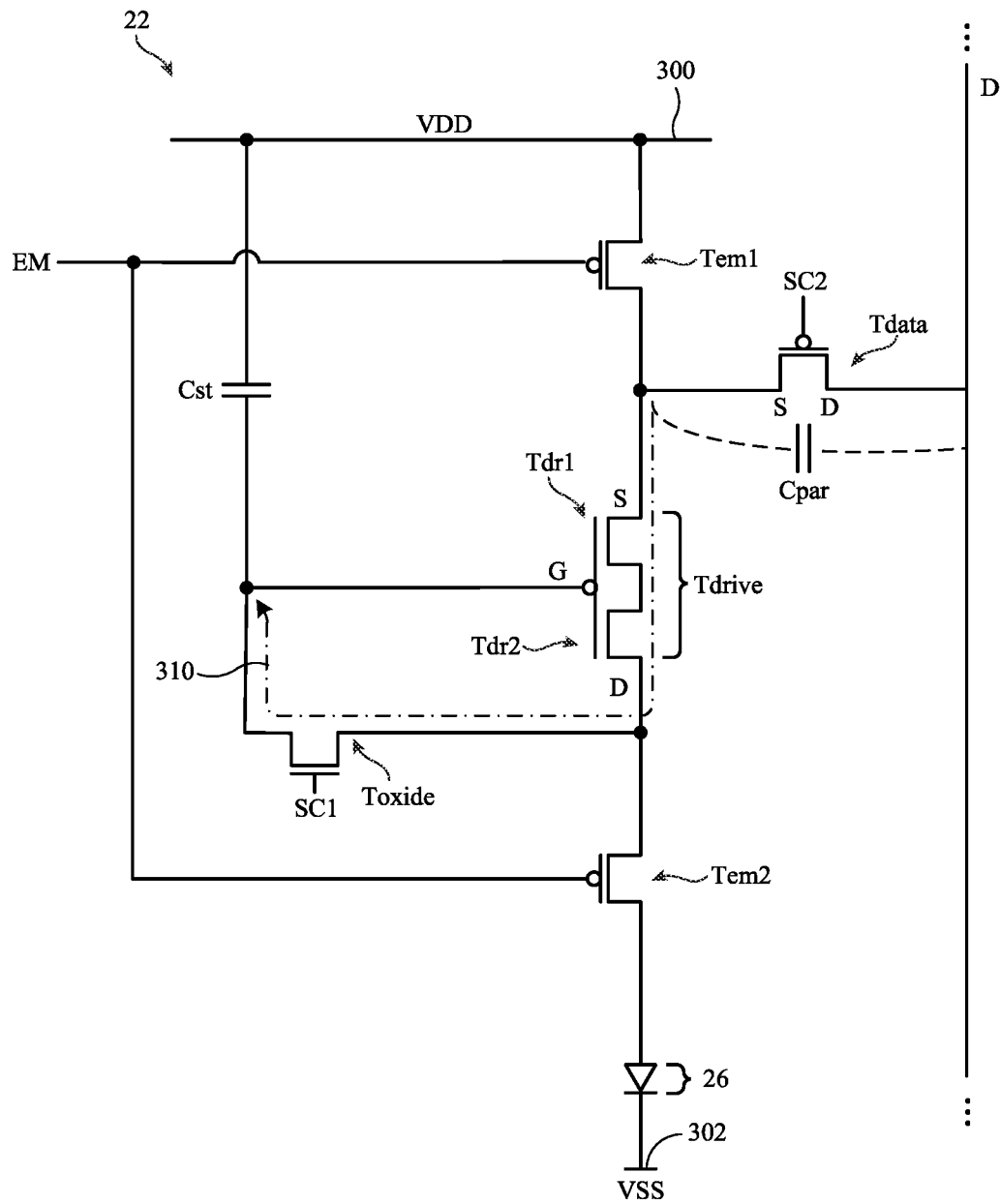
FIG. 3 is a circuit diagram of an illustrative organic light-emitting diode display pixel in accordance with some embodiments.

FIG. 3 is a circuit diagram of an illustrative organic light-emitting diode display pixel 22 in display 14. As shown in FIG. 3, display pixel 22 may include an organic light-emitting diode such as diode 26, a capacitor such as storage capacitor Cst, an n-type (i.e., n-channel) transistor such as semiconducting-oxide transistor Toxide, and p-type (i.e., p-channel) transistors such as drive transistor circuitry Tdrive, a data loading transistor Tdata, and emission transistors Tem1 and Tem2. While transistor Toxide is formed using semiconducting oxide (e.g., a transistor with a channel formed from semiconducting oxide such as indium gallium zinc oxide or IGZO), the other p-channel transistors may be thin-film transistors formed from a semiconductor such as silicon (e.g., polysilicon channel deposited using a low temperature process, sometimes referred to as LTPS or low-temperature polysilicon).

A semiconducting-oxide transistor is notably different from an n-type metal-oxide-semiconductor (NMOS) transistor or a p-type metal-oxide-semiconductor (PMOS) transistor. As described above, a semiconducting-oxide transistor has a channel region formed from semiconducting-oxide material such as IGZO. In contrast, an NMOS transistor has a channel region formed from a p-doped silicon substrate and a PMOS transistor has a channel region formed from an n-doped silicon substrate. Silicon transistors are also different than NMOS and PMOS transistors in that silicon transistors have channel regions formed from LTPS material. Semiconducting-oxide transistors exhibit lower leakage than silicon transistors, so implementing transistor Toxide as a semiconducting-oxide transistor will help reduce flicker (e.g., by preventing current from leaking away from the gate terminal of drive transistor Tdrive).

In accordance with some embodiments, drive transistor circuitry Tdrive may include multiple transistor portions coupled in series. As shown in FIG. 3, drive circuitry Tdrive may include a first drive transistor portion Tdr1 and a second drive transistor portion Tdr2 connected in series with Tdr1. The first drive transistor portion Tdr1 may have a source region that serves as the source (S) terminal for drive transistor circuitry Tdrive. The second drive transistor portion Tdr2 may have a drain region that serves as the drain (D) terminal for drive transistor circuitry Tdrive. First and second drive transistor portions Tdr1 and Trd2 may have a shared gate conductor G that extends over the silicon channel regions of both transistor portions Tdr1 and Tdr2. Drive transistor circuitry Tdrive configured in this way is sometimes referred to as a dual gate drive transistor. The terms "source" and "drain" terminals that are used to describe current-conducting terminals of a transistor are sometimes interchangeable and may sometimes be referred to herein as "source-drain" terminals.

The example of FIG. 3 in which transistor Toxide is a semiconducting-oxide transistor while the remainder transistors Tdata, Tdrive, Tem1 and Tem2 are p-type silicon transistors is merely illustrative. In another suitable arrangement, drive transistor circuitry Tdrive may be a semiconducting-oxide transistor. If desired, any of the remaining transistors Tdata, Tem1, and Tem2 others may be implemented as semiconducting-oxide transistors. Moreover, any one or more of the p-channel silicon transistors Tdata, Tdrive, Tem1 and Tem2 may be n-type (i.e., n-channel)

thin-film silicon transistors. As another example, display pixel 22 may further include one or more anode reset transistors for resetting the anode terminal of light-emitting diode 26. As another example, display pixel 22 may further include one or more initialization transistors for apply an initialization or reference voltage to an internal node within pixel 22. As another example, display pixel 22 may further include additional switching transistors (e.g., one or more additional semiconducting-oxide transistors or silicon transistors) for applying one or more bias voltages for improving the performance or operation of pixel 22.

Drive transistor circuitry Tdrive, emission control transistors Tem1 and Tem2, and light-emitting diode 26 may be coupled in series between positive power supply line 300 and ground power supply line 302. Emission transistors Tem1 and Tem2 have gate terminals configured to receive emission control signal EM. A positive power supply voltage VDD may be supplied to positive power supply terminal 300, whereas a ground power supply voltage VSS may be supplied to ground power supply terminal 302. Positive power supply voltage VDD may be 3 V, 4 V, 5 V, 6 V, 7 V, 2 to 8 V, greater than 6 V, greater than 8 V, greater than 10 V, greater than 12 V, 6-12 V, 12-20 V, or any suitable positive power supply voltage level. Ground power supply voltage VSS may be 0 V, −1 V, −2 V, −3 V, −4 V, −5 V, −6V, −7 V, less than 2 V, less than 1 V, less than 0 V, or any suitable ground or negative power supply voltage level. During emission operations, signal EM is asserted (e.g., driven low) to turn on transistors Tem1 and Tem2, which allows current to flow from drive transistor circuitry Tdrive to diode 26. The state of drive transistor circuitry Tdrive controls the amount of current flowing from terminal 300 to terminal 302 through diode 26, and therefore the amount of emitted light from display pixel 22.

In the example of FIG. 3, storage capacitor Cst may be coupled between power supply terminal 300 and the gate terminal of drive transistor circuitry Tdrive. Transistor Toxide may have a first source-drain terminal connected to the gate terminal of transistor circuitry Tdrive, a second source-drain terminal connected to the drain terminal of transistor circuitry Tdrive, and a gate terminal configured to receive a first scan control signal SC1. Data loading transistor Tdata may have a source terminal connected to the source terminal of transistor circuitry Tdrive, a drain terminal connected to data line D, and a gate terminal configured to receive a second scan control signal SC2. Scan control signals SC1 and SC2 may be provided over row control lines (see lines G in FIG. 2). Although display pixel 22 is shown to include only one capacitor Cst, display pixel 22 may include any suitable number of capacitors. As another example, pixel 22 can include a total of two capacitors. As another example, pixel 22 can include a total of three capacitors. As yet another example, pixel 22 can include more than three capacitor components.

Pixel 22 may be subject to process, voltage, and temperature (PVT) variations. Due to such variations, transistor threshold voltages between different display pixels 22 may vary. Variations in the threshold voltage of transistor circuitry Tdrive can cause different display pixels 22 to produce amounts of light that do not match the desired image. In an effort to mitigate threshold voltage variations, display pixel 22 of the type shown in FIG. 3 may be operable to support in-pixel threshold voltage (Vth) compensation. In-pixel threshold voltage (Vth) compensation operations, sometimes referred to as an in-pixel Vth canceling scheme, may generally include at least an initialization phase, a threshold voltage sampling phase, a data programming phase, and an emission phase. During the threshold voltage sampling phase, the threshold voltage of transistor circuitry Tdrive may be sampled using storage capacitor Cst. Subsequently, during the emission phase, emission current flowing through transistors Tem1 and Tem2 into the light-emitting diode 26 may have a term that cancels out with the sampled Vth. As a result, the emission current will be independent of the drive transistor Vth and therefore be immune to any Vth variations at the drive transistor.

Figure 4:
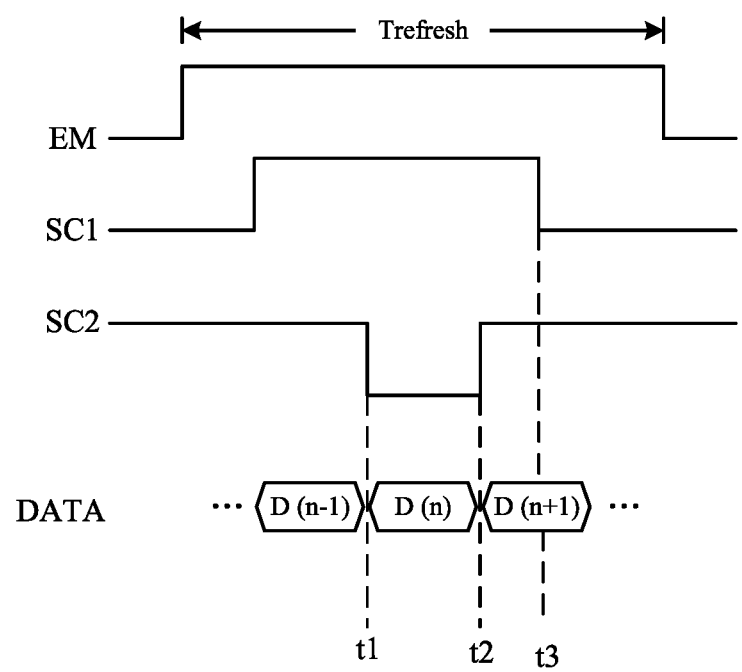
FIG. 4 is a timing diagram showing illustrative waveforms involved in operating the display pixel of FIG. 3 in accordance with some embodiments.

FIG. 4 is a timing diagram showing illustrative waveforms involved in operating display pixel 22 of the type shown in FIG. 3. As shown in FIG. 4, emission control signal EM may be deasserted (e.g., driven high) during a refresh phase Trefresh. Before and after refresh phase Trefresh, the emission control signal EM is asserted (e.g., driven low), which turns on the emission transistors Tem1 and Tem2 to allow light-emitting diode 26 to emit light. During Trefresh, scan signal SC1 may be pulse high to turn on semiconducting-oxide transistor Toxide. From time t1 and t2, scan signal SC2 may be pulsed low to turn on data loading transistor Tdata. Turning on transistor Tdata can load a desired data signal D(n) from the data line into pixel 22 while signal SC2 is asserted from time t1 to t2. In other words, pixel 22 in row n should receive data signal value D(n).

At time t3, scan signal SC1 may be driven low to turn off n-type transistor Toxide. At time t3, the data line may already be driven to a new data value D(n+1) that is intended for the next pixel row (i.e., row n+1). If care is not taken, the new data signal D(n+1)—which might be different than D(n)—may inadvertently be coupled to the source terminal of the drive transistor circuitry Tdrive in row n. This undesired coupling may be due to a parasitic coupling capacitance Cpar (see FIG. 3) existing between the data line and the source terminal S of drive transistor circuitry Tdrive when the data line is routed directly over and is directly overlapping the source region of circuitry Tdrive. This parasitic coupling may be indirectly coupled to the gate terminal G of circuitry Tdrive via coupling path 310 (since transistor Toxide is turned on as long as SC1 is driven high between times t2 and t3), which causes an undesired voltage change at gate G. When the drive transistor gate voltage changes in this way, an inaccurate amount of light will be emitted from diode 26. This phenomenon in which the data value from one pixel row is inadvertently coupled to a display pixel in an adjacent pixel row is sometimes referred to a row-to-row pixel crosstalk.

Figure 5A:
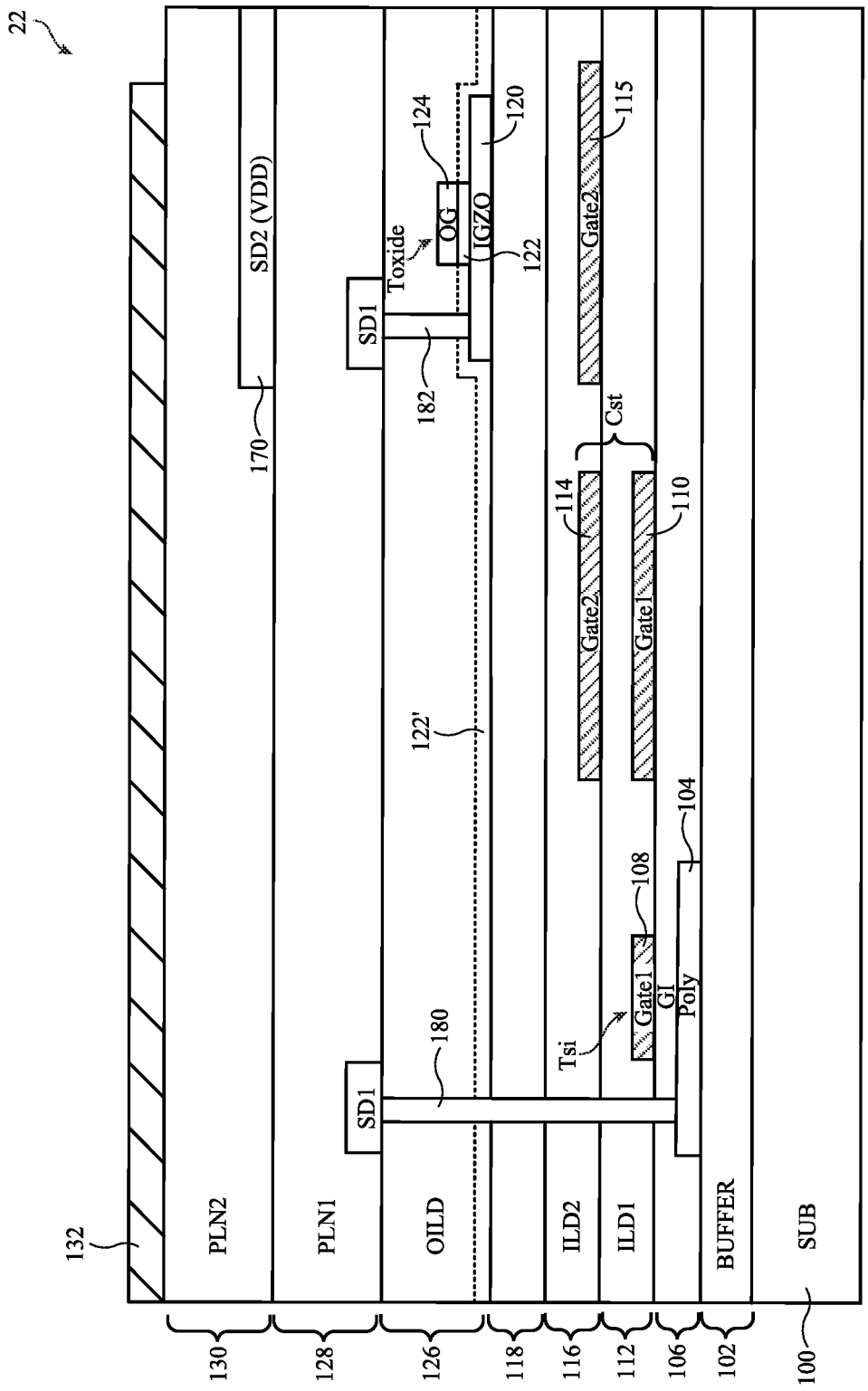
FIGS. 5A and 5B are cross-sectional side views of an illustrative display pixel having silicon transistors and semiconducting-oxide transistors in accordance with some embodiments.
Figure 5B:
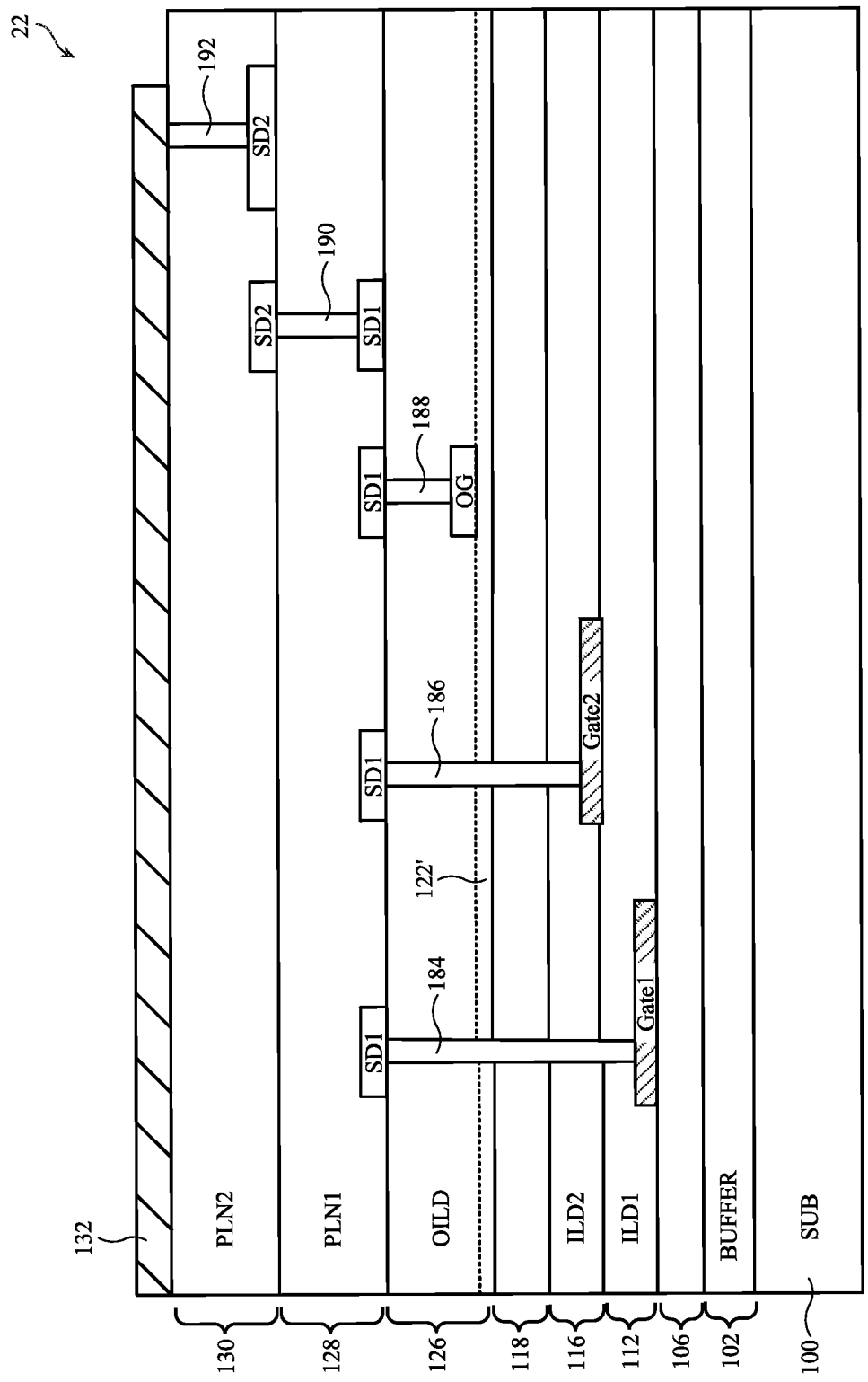

FIGS. 5A and 5B are cross-sectional side views of illustrative thin-film transistor (TFT) layers in display pixel 22. As shown in FIGS. 5A and 5B, the TFT layers may include a substrate layer such as substrate 100. Substrate 100 may optionally be covered with one or more buffer layers 102. Buffer layer(s) 102 may include inorganic buffer layers such as layers of silicon oxide, silicon nitride, or other passivation or dielectric material.

A polysilicon layer (e.g., a low temperature polysilicon or "LTPS" layer) may be formed on inorganic buffer layer 102. Polysilicon layer 104 may be patterned and etched to form an LTPS or silicon trace 104. The two opposing ends of silicon trace 104 may optionally be doped (e.g., n-doped or p-doped) to form source-drain regions of a silicon transistor Tsi (e.g., an LTPS transistor) within display pixel 22.

A gate insulator (GI) layer 106 may be formed on buffer layer 102 and over silicon trace 104. As an example, the gate insulating layer 106 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material.

A first metal layer (e.g., a first gate metal layer Gate1) may be formed over the gate insulator layer 106. The Gate1 metal layer may be formed using aluminum, nickel, chromium, copper, molybdenum, titanium, silver, gold, a combination of these materials, other metals, or other suitable gate conductors. The Gate1 metal layer may be patterned and etched to form a gate conductor 108 for the silicon transistor Tsi. If desired, the Gate1 metal layer may also be patterned and etched to form a terminal of one or more capacitor inside pixel 22 (see conductive plate 110 formed from the Gate1 metal layer configured as a lower terminal of storage capacitor Cst).

In general, display pixel 22 may include any suitable number of silicon transistors (if any). Thus, the cross-section of FIG. 5A in which pixel 22 is shown to have only one silicon transistor Tsi is merely illustrative. In some embodiments, pixel 22 may be provided with at least four silicon transistors. As another example, pixel 22 may be provided with five or more silicon transistors. As another example, pixel 22 may include 5 to 10 silicon transistors. As yet another example, pixel 22 may include more than 10 silicon transistors.

A first interlayer dielectric (ILD1) layer 112 may be formed over the first gate metal layer and the silicon transistor. ILD layer 112 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material.

A second metal layer (e.g., a second gate metal layer Gate2) may be formed on ILD1 layer 112. The Gate2 metal layer may be formed using similar or different materials as the Gate1 metal layer. The Gate2 metal layer may be patterned and etched to form another terminal of one or more capacitor inside pixel 22 (see conductive plate 114 formed from the Gate2 metal layer configured as an upper terminal of storage capacitor Cst). In some embodiments, a bottom shielding layer such as Gate2 metal shielding layer 115 may be formed directly under semiconducting-oxide transistor Toxide. Configured in this way, the bottom Gate2 metal shielding layer 115 may protect transistor Toxide from undesired parasitic effects that can original from below transistor Toxide.

A second interlayer dielectric (ILD2) layer 116 may be formed over the second Gate2 metal layer. Dielectric layer 116 may be formed using similar or different materials as the ILD1 layer 112. One or more buffer layers such as buffer layer 118 (e.g., an inorganic buffer layer such a silicon oxide layer, silicon nitride layer, etc.) can optionally be formed over dielectric layer 116.

A semiconducting-oxide layer (e.g., an indium gallium zinc oxide or "IGZO" layer) may be formed over buffer layer 118. Buffer layer 118 is therefore sometimes referred to as an oxide buffer layer. The semiconducting-oxide layer may be patterned and etched to form semiconducting-oxide trace 120. The two opposing ends of semiconducting-oxide trace 120 may optionally be doped (e.g., n-doped or p-doped) to form source-drain regions of a semiconducting-oxide transistor such as transistor Toxide within display pixel 22.

An insulation layer such as gate insulator layer 122 may be formed on patterned semiconducting-oxide trace 120. A third gate metal layer OG may be formed on gate insulating layer 122. Third gate metal layer OG may be configured to serve as the gate conductor for the semiconducting-oxide transistor. The third gate metal layer may therefore sometimes be referred to as the oxide gate conductor or semiconducting-oxide gate conductor. The example of FIG. 5A in which gate insulating layer 122 is only formed underneath the oxide gate conductor is merely illustrative. In other embodiments, the oxide gate insulator 122 may be formed as a blanket layer 122' across the surface of oxide buffer layer 118 (see, e.g., dotted layer 122' in FIG. 5A and layer 122' in FIG. 5B). Another interlayer dielectric (OILD) layer 126 may be formed on buffer layer 118 and over semiconducting-oxide transistor Toxide.

In general, display pixel 22 may include any suitable number of semiconducting-oxide transistors (if any). Thus, the cross-section of FIG. 5A in which pixel 22 is shown to include only one semiconducting-oxide transistor Toxide is merely illustrative. In some embodiments, pixel 22 may be provided with only two semiconducting-oxide transistors. As another example, pixel 22 may be provided with three or more semiconducting-oxide transistors. As another example, pixel 22 may include four to six semiconducting-oxide transistors. As another example, pixel 22 may include less than three semiconducting-oxide transistors. As another example, pixel 22 may include less than four semiconducting-oxide transistors. As another example, pixel 22 may include less than five semiconducting-oxide transistors. As yet another example, pixel 22 may include more than five semiconducting-oxide transistors. If desired, pixel 22 may include only semiconducting-oxide thin-film transistors.

In yet other embodiments, pixel 22 may not include any semiconducting-oxide transistors. In arrangements where pixel 22 is entirely free of semiconducting-oxide transistors, one or more of the TFT layers such as the oxide buffer layer 118, the semiconducting-oxide layer, oxide gate liner 122, the oxide gate conductor layer 124, and/or the oxide ILD layer 126 may not be formed when fabricating pixel 22. Layers Gate2 and dielectric layer 112 are also optional if not needed to form capacitor structures 110 and 114.

A first source-drain metal routing layer SD1 may be formed on dielectric layer 126. The SD1 metal routing layer may be formed from aluminum, nickel, chromium, copper, molybdenum, titanium, silver, gold, a combination of these materials, other metals, or other suitable metal routing conductors. The SD1 metal routing layer may be patterned and/or etch to form SD1 metal routing paths. As shown in FIG. 5A, some of the SD1 metal routing paths may be coupled using vertical via(s) 180 to one or more source-drain region associated with the silicon transistor. Some of the SD1 metal routing paths may be coupled to one or more source-drain region associated with semiconducting-oxide transistor Toxide using vertical via(s) 182 formed through layer 126. As shown in FIG. 5B, some of the SD1 metal routing paths may be coupled using vertical via(s) 184 to a Gate1 metal conductor. Some of the SD1 metal routing paths may be coupled using vertical via(s) 186 to a Gate2 metal conductor. Some of the SD1 metal routing paths may be coupled using vertical via(s) 188 to an oxide gate conductor.

A first planarization (PLN1) layer such as layer 128 may be formed over the SD1 metal routing layer. Planarization layer 128 may be formed from organic dielectric materials such as polymer. A second source-drain metal routing layer SD2 may be formed on organic planarization layer 128. The SD2 metal routing layer may be formed using the same, similar, or different materials than the SD1 metal routing layer. The SD2 metal routing layer may be patterned and/or etch to form SD2 metal routing paths. Some of the SD2 metal routing paths may be selectively coupled to some of the SD1 metal routing paths using vertical via(s) 190 formed through first planarization layer 128. In some embodiments, a metal shielding layer such as metal shielding layer 170 may be formed at least partially over and covering transistor Toxide (e.g., metal shield 170 may directly overlap and cover at least a portion of transistor Toxide). If desired, metal shielding layer 170 may completely cover transistor Toxide (e.g., metal shielding layer 170 may have peripheral edges extending past the source-drain regions of the semiconducting-oxide transistor). Metal shielding layer 170 may be formed in the SD2 metal routing layer (as an example). Metal shielding layer 170 may be biased to positive power supply voltage VDD, ground power supply voltage VSS, or other static voltage levels. Configured in this way, layer 170 may shield transistor Toxide from undesired sources of noise or parasitic coupling originating from components above transistor Toxide.

A second planarization (PLN2) layer such as layer 130 may be formed on planarization layer 128 and over the SD2 routing metal lines. Planarization layer 130 may also be formed from organic dielectric materials such as a polymer. An anode layer including an anode conductor 132 forming the anode terminal of the organic light-emitting diode within pixel 22 may be formed on planarization layer 130. Anode conductor 132 may be coupled to at least some of the SD2 metal routing paths using vertical via(s) 192 formed through planarization layer 130. Additional structures may be formed over the anode layer. For example, a pixel definition layer, a spacer structure, organic light-emitting diode emissive material, a cathode layer, and other pixel structures may also be included in the stackup of display pixel 22. However, these additional structures are omitted for the sake of clarity and brevity.

The arrangement of FIGS. 5A and 5B in which the storage capacitor is non-overlapping with transistors Tsi and Toxide is merely illustrative. In another example, storage capacitor Cst may at least partially or completely overlap a silicon transistor (e.g., Cst may be formed directly over the silicon transistor). In another example, storage capacitor Cst may at least partially or completely overlap a semiconducting-oxide transistor (Cst may be formed directly under the semiconducting-oxide transistor). A silicon trace may be coupled to another gate conductor (e.g., a Gate1, Gate2, or OG metal conductor), to an SD1 metal routing path, and/or to an SD2 metal routing path. The gate conductor of either a silicon transistor and/or a semiconducting-oxide transistor may be coupled to another gate conductor (e.g., a Gate1, Gate2, or OG metal conductor), to an SD1 metal routing path, and/or to an SD2 metal routing path. A Gate1 metal conductor may be coupled to another gate conductor (e.g., a Gate1, Gate2, or OG metal conductor), to an SD1 metal routing path, and/or to an SD2 metal routing path. A Gate2 metal conductor may be coupled to another gate conductor (e.g., a Gate1, Gate2, or OG metal conductor), to an SD1 metal routing path, and/or to an SD2 metal routing path. A semiconducting-oxide trace may be coupled to another gate conductor (e.g., a Gate1, Gate2, or OG metal conductor), to an SD1 metal routing path, and/or to an SD2 metal routing path. An oxide gate conductor may be coupled to another gate conductor (e.g., a Gate1, Gate2, or OG metal conductor), to an SD1 metal routing path, and/or to an SD2 metal routing path.

Figure 6:
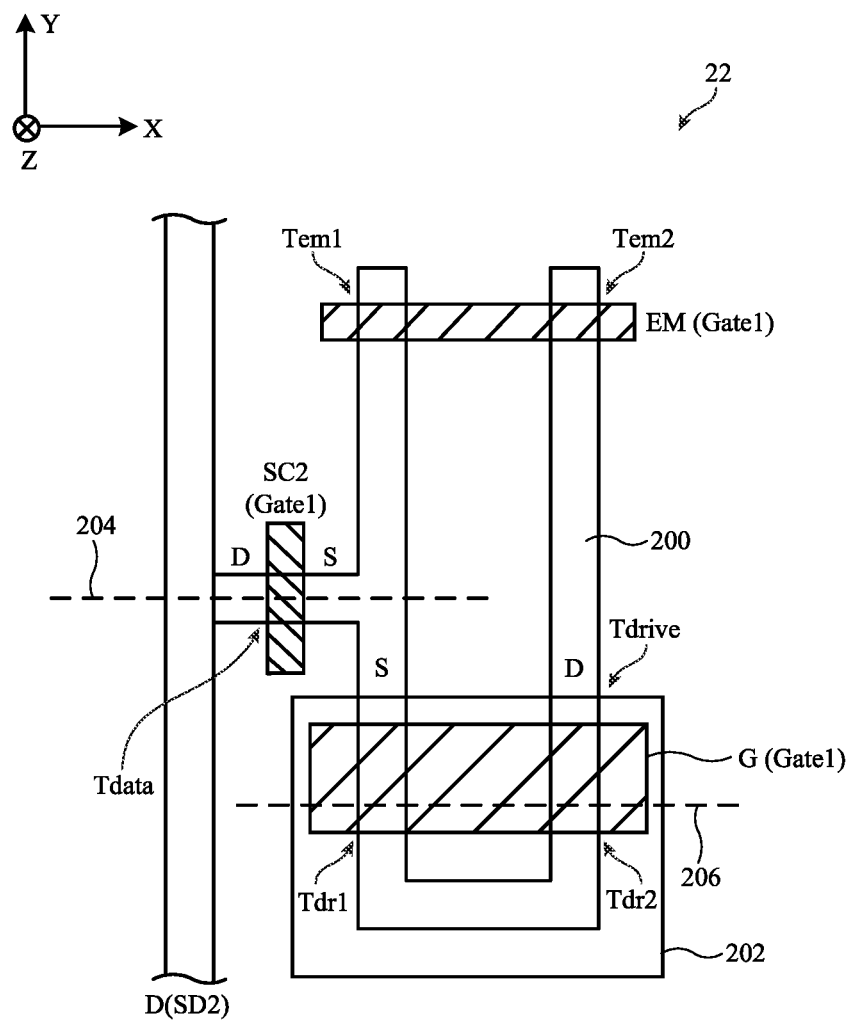
FIG. 6 is a top (layout) plan view of illustrative thin-film transistor structures within a display pixel in accordance with some embodiments.

FIG. 6 is a top layout (plan) view, looking in the Z direction into the X-Y plane, of a portion of display pixel 22 of the type described in connection with at least FIGS. 3 and 5. FIG. 6 shows thin-film transistor structures associated with drive transistor circuitry Tdrive, the data loading transistor Tdata, and the emission transistors Tem1 and Tem2. Transistor circuitry Tdrive, Tdata, Tem1, and Tem2 may all be silicon (e.g., LTPS) transistors and are all interconnected using a silicon trace such as silicon trace 200. A portion of the silicon trace 200 may be represented by silicon layer 104 in FIG. 5A (as an example).

A portion of silicon trace 200 that is overlapped by the EM metal routing line (e.g., formed using the Gate1 metal routing layer) may represent the channel region for the first emission control transistor Tem1. The EM metal routing line may run parallel to the X axis. Another portion of silicon trace 200 that is overlapped by the EM metal routing line may represent the channel region of the second emission control transistor Tem2.

Another portion of silicon trace 200 may extend along the X axis. The portion of silicon trace 200 extending along the X axis may be overlapped by a SC2 metal routing line (e.g., also formed using the Gate1 metal routing layer). The portion of trace 200 overlapped by the SC2 metal routing line may represent the channel region of data loading transistor Tdata. The SC2 metal routing line may run parallel to the Y axis. Transistor Tdata has a drain region (e.g., the left terminal in FIG. 6) connected to the data line. The data line may, for example, be formed using the SD2 metal routing layer and routed parallel to the Y axis. Transistor Tdata has a source region (e.g., the right terminal in FIG. 6) connected to the source (S) terminal of the drive transistor circuitry Tdrive.

Other portions of silicon trace 200 extending parallel to the Y axis may be overlapped by gate conductor G (e.g., also optionally formed using the Gate1 metal routing layer). A first portion of trace 200 overlapped by the G conductor may represent the channel region of the first drive transistor portion Tdr1. A second portion of trace 200 overlapped by conductor G may represent the channel region of the second drive transistor portion Tdr2. The first drive transistor portion Tdr1 has a first terminal (e.g., upper terminal in FIG. 6) that serves as the source S terminal of circuitry Tdrive, which is directly connect to the data loading transistor Tdata. The first drive transistor portion Tdr1 has a second terminal (e.g., lower terminal in FIG. 6) that is connected in series with the second drive transistor portion Tdr2.

The second drive transistor portion Tdr2 has a first terminal (e.g., upper terminal in FIG. 6) that serves as the drain D terminal of circuitry Tdrive, which is connected in series with the second emission control transistor Tem2. The second drive transistor portion Tdr2 has a second terminal (e.g., lower terminal in FIG. 6) that is connected in series with the first drive transistor portion Tdr1. An additional metal layer such as metal plate 202 may be formed above and covering the drive transistor circuitry Tdrive. Metal layer 202 may partially cover or completely cover the source-drain regions of transistor Tdrive. Metal plate 202 (e.g., a metal layer configured to receive a positive power supply voltage, a ground power supply voltage, or other static voltages) may help shield and protect the drive transistor circuitry from undesired parasitic coupling effects.

The arrangement of FIG. 6 in which the data line D only overlaps with the drain region of transistor Tdata but is non-overlapping with the source region of transistor Tdata can dramatically reduce the parasitic coupling (see Cpar in FIG. 3) between the data line and the source region of transistor Tdata. Since the source region of transistor Tdata is also directly connected to the source terminal of circuitry Tdrive, reducing the parasitic coupling in this way can help mitigate or reduce the row-to-row data crosstalk that might arise when signal SC1 is deasserted. This is also achieved by routing data line D in the vertical (Y) direction and forming data loading transistor Tdata in the horizontal (X) direction such that the distance between data line D and the source region of transistor Tdata is maximized. In other words, the channel region of transistor Tdata extends along the X direction.

Figure 7:
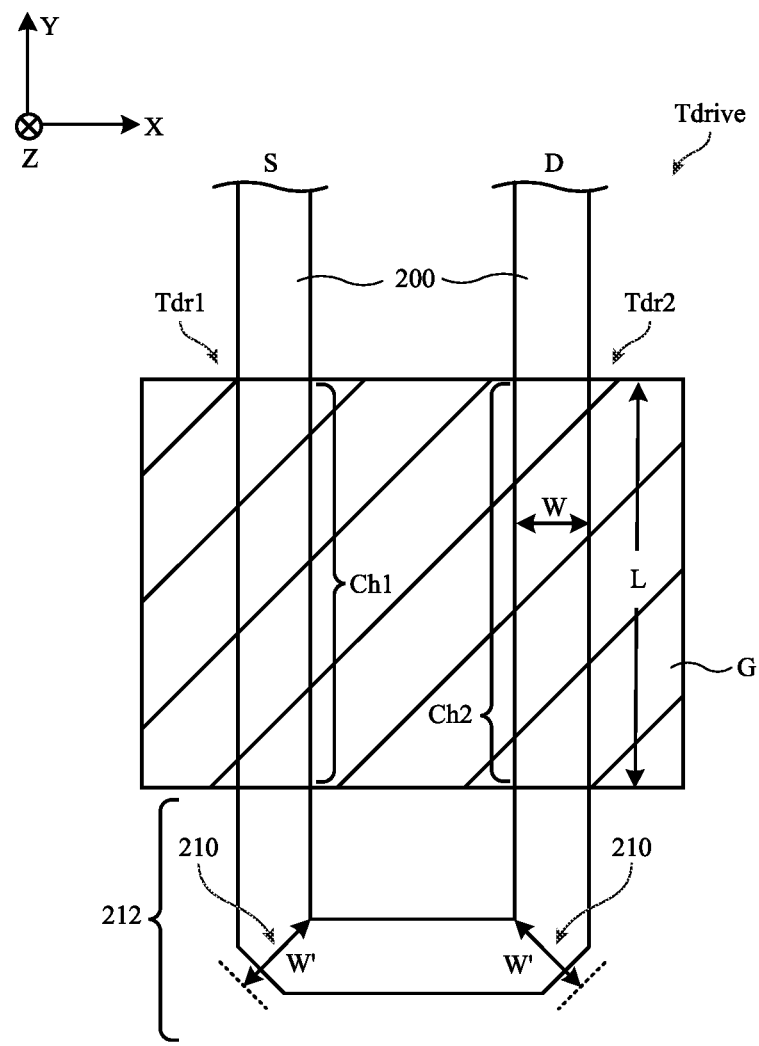
FIG. 7 is a top (layout) plan view showing illustrative drive transistor circuitry with a dual gate arrangement in accordance with some embodiments.

FIG. 7 is a top (layout) plan view looking in the Z direction showing additional details of drive transistor circuitry. As shown in FIG. 7, drive transistor circuitry Tdrive may be formed using silicon trace 200 and gate conductor G. A first portion of silicon trace 200 that is directly overlapped (covered) by conductor G represents the channel region Ch1 of the first drive transistor portion Tdr1. A second portion of silicon trace 200 that is directly overlapped (covered) by conductor G represents the channel region Ch2 of the second drive transistor portion Tdr2. Channel region Ch1 may be parallel to channel region Ch2. Channel regions Ch1 and Ch2 of drive transistor circuitry extend along the Y direction. Silicon trace 200 may have a width W extending in the X direction and a length L extending in the Y direction. As an example, length L may be at least two times longer than width W. As another example, length L may be at least three times longer than width W. As another example, length L may be at least four times longer than width W. As another example, length L may be at least five times longer than width W. As another example, length L may be two-five times longer than width W. As another example, length L may be five to ten times longer than width W. In other words, the channel length of the drive transistor circuitry may be dramatically longer than its channel width.

The first drive transistor portion Tdr1 is connected in series with the second drive transistor portion Tdr2 using silicon trace portion 212. Silicon trace portion 212 is not covered or overlapped by the gate conductor G. Silicon trace portion 212 includes at least two bends 210. Each bend may be a 90° turn or kink (as an example). Silicon trace portion 212 has a first segment parallel to the Y axis, a second segment parallel to the Y axis, and a third segment parallel to the X axis. The third segment connects the first segment to the second segment. The first segment is connected to the third segment at the first bend 210 (e.g., a first 90 degree turn). The second segment is connected to the third segment at the second bend 210 (e.g., a second 90 degree turn). The example of drive transistor circuitry Tdrive having a silicon trace with only two bends in merely illustrative. In general, the drive transistor circuitry Tdrive may have a silicon trace with only one bend, with more than two bends, with three or more bends, with four or more bends, with five or more bends, with six or more bends, with no bends, or any suitable number of bends.

Fabricating bends such as 90° bends in silicon trace 200 may be challenging. The manufacturing challenges may result in inconsistencies at these bends, which can cause the width W' of silicon trace 200 to vary at each bend 210. Width W' at a bend 210 is therefore sometimes referred to herein as the bend width. In some instances, trace 200 may have a bend width W' that is slightly narrower than the nominal width W that is typically seen along the rest of the silicon trace. In other instances, trace 200 may have a bend width W' that is slightly wider than the nominal width W. Bends 210 are not part of either channel region Ch1 or Ch2. Forming silicon trace portion 212 having bends 210 outside of the gate conductor region G is advantageous since the channel regions of drive transistor portions Tdr1 and Tdr2 will not be affected by potential variations in the bend widths W'. Additional benefits also include reduced deviation in leakage current through the drive transistor circuitry at low gray levels.

Figure 8:
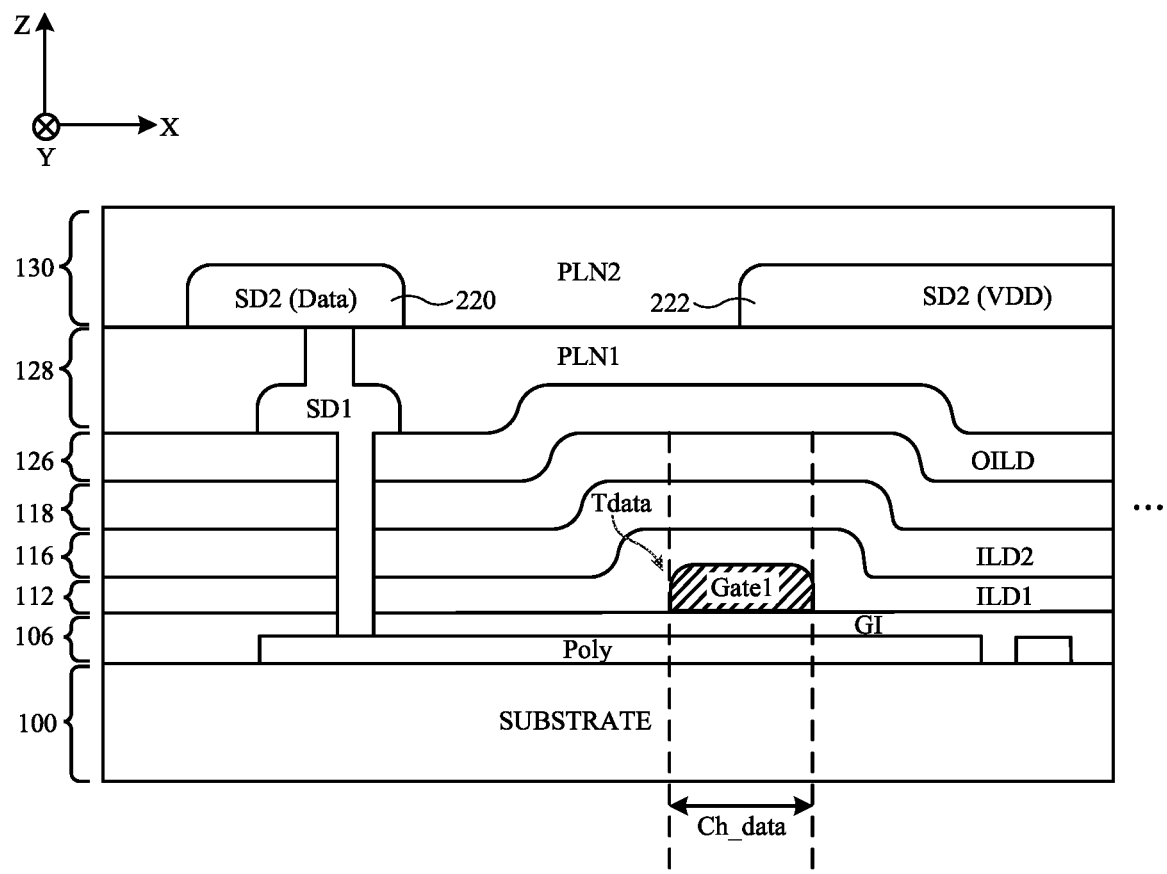
FIG. 8 is a cross-sectional side view of an illustrative data loading transistor in accordance with some embodiments.

FIG. 8 is a cross-sectional side view of data loading transistor Tdata cut along line 204 of FIG. 6. As shown in FIG. 8, data loading transistor Tdata is a silicon transistor having a silicon trace formed in the LTPS layer and a gate conductor formed using the Gate1 metal layer. The portion of the silicon trace overlapped by the Gate1 conductor may represent the channel region Ch_data of the data loading transistor. The drain terminal of the data loading transistor may be coupled to a data line 220 in the SD2 metal routing layer using intervening vias and SD1 metal routing. In some embodiments, a metal shielding layer such as metal shielding layer 222 may be formed at least partially over and covering the data loading transistor (e.g., metal shield 222 may directly overlap and cover at least a portion of transistor Tdata when viewed from above in the X-Y plane). If desired, metal shielding layer 222 may completely cover transistor Tdata (e.g., metal shielding layer 222 can have peripheral edges extending past the source-drain regions of the data loading transistor). Metal shielding layer 222 may be formed in the SD2 metal routing layer (as an example). Metal shielding layer 222 may be biased to positive power supply voltage VDD, ground power supply voltage VSS, or other static voltage levels. Configured in this way, layer 222 may shield transistor Tdata from undesired sources of noise or parasitic coupling.

Figure 9:
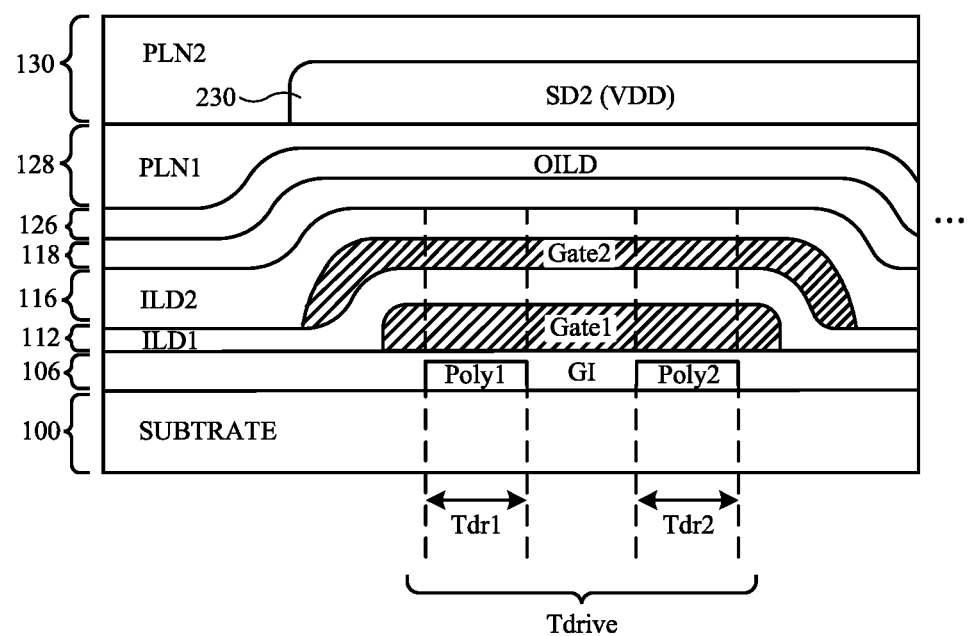
FIG. 9 is a cross-sectional side view of illustrative drive transistor circuitry in accordance with some embodiments.

FIG. 9 is a cross-sectional side view of drive transistor circuitry Tdrive cut along line 206 of FIG. 6. As shown in FIG. 9, drive circuitry Tdrive is a silicon transistor having a silicon traces formed in the LTPS layer and a gate conductor formed using the Gate1 metal layer. A portion of the silicon trace (labeled Poly1) overlapped by the Gate1 conductor may represent the channel region Ch1 of the first drive transistor portion Tdr1. Another portion of the silicon trace (labeled Poly2) overlapped by the Gate1 conductor may represent the channel region Ch2 of the second drive transistor portion Tdr2. The Gate1 metal may be used to form the gate conductor of the drive transistor circuitry and may also be used to form the bottom plate of the storage capacitor. A Gate2 metal layer may be formed directly over the Gate1 metal. The Gate2 metal may be used to form the top plate of the storage capacitor. In other words, the storage capacitor may be formed directly over the drive transistor circuitry to help reduce the overall area of the display pixel.

In some embodiments, a metal shielding layer such as metal shielding layer 230 may be formed at least partially over and covering the drive transistor circuitry (e.g., metal shield 230 may directly overlap and cover at least a portion of circuitry Tdrive when viewed from above in the X-Y plane). In the example of FIG. 9, metal shield 230 may completely cover drive transistor circuitry Tdrive (e.g., shielding layer 230 may have a peripheral edge that extends past the channel regions of Tdrive). Metal shielding layer 230 may be formed in the SD2 metal routing layer (as an example). Metal shielding layer 230 may be supplied with positive power supply voltage VDD, ground power supply voltage VSS, or other static voltage levels. Configured in this way, layer 230 may shield circuitry Tdrive from undesired sources of noise or parasitic coupling.

The foregoing is merely illustrative and various modifications can be made to the described embodiments. The foregoing embodiments may be implemented individually or in any combination.

What is claimed is:

1. A display, comprising:
   display pixels configured to display an image; and
   a data line configured to provide data signals to at least some of the display pixels, wherein at least one of the display pixels comprises:
   a light-emitting diode;
   drive transistor circuitry coupled in series with the light-emitting diode; and
   a data loading transistor having a source region and a drain region, wherein
   the source region is coupled to the drive transistor circuitry,
   the data line is coupled to and routed over the drain region, and
   the data line and the source region are non-overlapping to reduce crosstalk.

2. The display of claim 1, wherein the at least one of the display pixels further comprises:
   a semiconducting-oxide transistor coupled across the drain region and a gate of the drive transistor circuitry, wherein the drive transistor circuitry and the data loading transistor are silicon transistors;
   a storage capacitor directly coupled to the gate of the drive transistor circuitry; and
   a plurality of emission control transistors coupled in series with the light-emitting diode and the drive transistor circuitry.

3. The display of claim 1, wherein:
   the data loading transistor has a channel region that extends along a first direction;
   the drive transistor circuitry has a first channel region and a second channel region separate from the first channel region; and
   first and second channel regions extend along a second direction perpendicular to the first direction.

4. The display of claim 1, wherein the drive transistor circuitry comprises:
   a silicon trace forming a first drive transistor portion and a second drive transistor portion, wherein the first and second drive transistor portions are connected in series.

5. The display of claim 4, wherein the drive transistor circuitry further comprises:
   a gate conductor overlapping with the first drive transistor portion and the second drive transistor portion, wherein
   a first portion of the silicon trace that is overlapped by the gate conductor comprises a first channel region of the first drive transistor portion, and
   a second portion of the silicon trace that is overlapped by the gate conductor comprises a second channel region of the second drive transistor portion.

6. The display of claim 5, wherein the first channel region is parallel to the second channel region.

7. The display of claim 5, wherein
   a third portion of the silicon trace connects the first channel region to the second channel region, and
   the third portion of the silicon trace and the gate conductor are non-overlapping.

8. The display of claim 7, wherein the third portion of the silicon trace has at least two bends.

9. The display of claim 8, wherein the third portion of the silicon trace comprises:
   a first segment parallel to the first channel region;
   a second segment parallel to the second channel region; and
   a third segment connecting the first segment to the second segment, wherein the third segment is perpendicular to the first and second segments.

10. The display of claim 5, wherein
    the first channel region has a width and a length, and the length is at least two times longer than the width.

11. The display of claim 1, wherein the at least one of the display pixels further comprises:
    a metal shielding layer at least partially covering the data loading transistor.

12. The display of claim 11, wherein the metal shielding layer is configured to receive a power supply voltage.

13. The display of claim 1, wherein the at least one of the display pixels further comprises:
    a metal shielding layer covering the drive transistor circuitry, wherein the metal shielding layer is configured to shield the drive transistor circuitry from parasitic coupling.

14. The display of claim 13, wherein the metal shielding layer is biased to a power supply voltage level.

15. Display pixel circuitry comprising:
    a light-emitting diode;
    a data loading transistor having a drain region, a source region, and a channel region, wherein the channel region extends along a first direction between the drain and source regions;
    drive transistor circuitry having first and second separate channel regions extending along a second direction different than the first direction; and
    a data line coupled to the drain region without routing over the source region to reduce row-to-row crosstalk.

16. The display pixel circuitry of claim 15, wherein the second direction is perpendicular to the first direction.

17. The display pixel circuitry of claim 15, wherein the first and second separate channel regions are connected by a silicon trace portion having multiple bends.

18. The display pixel circuitry of claim 17, wherein the drive transistor circuitry further comprises:
    a gate conductor overlapping with the first and second separate channel regions, wherein the gate conductor and the silicon trace portion are non-overlapping.

19. The display pixel circuitry of claim 15, further comprising:
    a metal layer covering the drive transistor circuitry, wherein
    the metal layer is configured to shield the drive transistor circuitry from parasitic coupling, and
    the metal layer is configured to receive a positive power supply voltage.

20. An electronic device comprising:
    control circuitry; and
    a display configured to receive control signals from the control circuitry, wherein the display comprises:
    an array of pixels; and
    data lines coupled to respective columns of pixels in the array, wherein each pixel in the array comprises:
    an organic light-emitting diode;
    silicon drive transistor circuitry with at least two separate channel regions, wherein the silicon drive transistor circuitry has a gate terminal and a drain terminal;
    a semiconducting-oxide transistor connected across the gate and drain terminals of the silicon drive transistor circuitry; and a silicon data loading transistor configured to receive data signals from at least one of the data lines, wherein
the silicon data loading transistor has a source region and a drain region, and
the at least one of the data lines is coupled to the drain region without being routed over the source region.

\* \* \* \* \*